(12) United States Patent
Chang

(10) Patent No.: US 6,825,100 B2
(45) Date of Patent: Nov. 30, 2004

(54) METHOD FOR FABRICATING CONDUCTIVE LINE ON A WAFER

(75) Inventor: Ching-Tsai Chang, Hsinchu (TW)

(73) Assignee: Winbond Electronics Corporation (TW)

( * ) Notice: Subject to any disclaimer, the term of this patent is extended or adjusted under 35 U.S.C. 154(b) by 298 days.

(21) Appl. No.: 10/079,575

(22) Filed: Feb. 22, 2002

(65) Prior Publication Data

US 2003/0162404 A1 Aug. 28, 2003

(51) Int. Cl.$^7$ ............................................. H01L 21/322
(52) U.S. Cl. ...................... 438/472; 438/652; 438/669; 438/679; 438/714; 438/715; 438/720
(58) Field of Search .................................. 438/472, 652, 438/669, 679, 706, 714, 715, 720

(56) References Cited

U.S. PATENT DOCUMENTS 5,994,219 A * 11/1999 Lin et al. .................... 438/669
6,156,646 A * 12/2000 Ishihara ...................... 438/652
6,337,136 B1 * 1/2002 Suzuki et al. ................ 428/472
6,420,263 B1 * 7/2002 Cheek et al. ................ 438/679

FOREIGN PATENT DOCUMENTS

| JP | S63-308914 | * | 6/1987 | ........... H01L/21/28 |
| JP | 2000-260775 | * | 9/2000 | ....... H01L/21/3213 |

* cited by examiner

*Primary Examiner*—Duy-Vu Deo
(74) *Attorney, Agent, or Firm*—Dickinson Wright PLLC

(57) ABSTRACT

A method for fabricating an Al—Si—containing alloy line, which is adapted to form a conductive line on a substrate, is described. A first conductive layer, a second conductive layer and an Al—Si—containing alloy layer are sequentially formed on the substrate. Then, the substrate temperature is rapidly lowered to between about 0° C. and 25° C. in about 1 second to 10 seconds. A patterned photo-resist layer is formed on the third conductive layer. The patterned photo-resist layer is used as a mask, and the third conductive layer, the Al—Si—containing alloy layer, the second conductive layer and the first conductive layer are etched to form the conductive line.

19 Claims, 3 Drawing Sheets

METHOD FOR FABRICATING CONDUCTIVE LINE ON A WAFER

BACKGROUND OF THE INVENTION

1. Field of Invention

The present invention relates to a method for fabricating an Al—Si—containing alloy line. More particularly, the present invention relates to forming a conductive line on a substrate.

2. Description of Related Art

When the integration of a semiconductor device increases, there is not enough surface area on a chip for interconnect formation. If the demand for interconnects, which are adapted to connect the semiconductor devices, is to be met, multilevel interconnects are a necessary element for the manufacture of the metal oxide semiconductor. The multilevel interconnect is always formed after the fabrication of the semiconductor device is complete and a connecting system is established for transporting electric message thereon.

Aluminum is a very important conductive material in the development of integrated circuit devices. Due to the low resistivity thereof, aluminum is suitable for decreasing the RC delay time and increasing the switching frequency. At the same time, there are some disadvantages in using aluminum as a conductive material, such as spiking and poor electromigration resistance. In order to overcome the disadvantages of the aluminum, appropriate amounts of silicon and copper are added in aluminum and aluminum-silicon-copper (Al—Si—containing) alloy is formed. Typically, the silicon content in the alloy is about 1% and the copper content in the alloy is about 0.5% to 4%.

Reference is made to FIG. 1, which illustrates a schematic, cross-sectional diagram showing an Al—Si—containing alloy conductive line as disclosed in the prior art. A wafer 100 with devices formed thereon is provided. A conductive layer 102 made of titanium, titanium silicide or tungsten titanium alloy is formed on the wafer 100 by deposition to lower the sheet resistance between conductive line and plugs (not shown in the figure). A conductive layer 104 made of titanium nitride or a tungsten titanium alloy film is deposited as a barrier layer and an adhesion layer. The main portion of the conductive line is an aluminum-copper-silicon film 106. Finally, a titanium nitride layer 108 is deposited on the aluminum-copper-silicon film 106 as an anti-reflection layer. The temperature for depositing titanium nitride is typically between about 100° C. and 200° C., but it also can be formed at room temperature. The aluminum-copper-silicon film 106 is formed by high temperature sputtering between about 300° C. and 500° C. and a subsequent reflow process at about 450° C. to 500° C. to increase the step coverage of the aluminum alloy.

Reference is made to FIG. 2, a schematic, which illustrates a cross-sectional diagram showing the silicon separating out in the Al—Si—containing alloy conductive line. The solubility of the silicon in aluminum decreases directly with temperature. In other words, a higher temperature means a greater solubility of the silicon in aluminum. Reference is made to FIG. 6, FIG. 6 is printed from M. Hansen and A. Anderko, "Constitution of Binary Alloys," McGraw-Hill, New York, 1958, which is a phase diagram of the silicon-containing percentage of Al—Si alloy at different temperatures. From the enlarged diagram positioned at the upper left corner, the solubility of the silicon in aluminum at 577° C. is about 1.5%, but when the temperature is lowered below 440° C., the solubility of the silicon decreases very quickly. If the Al—Si alloy cools down slowly, it will follow the curve of solid solubility and the ultra-saturated silicon in the Al—Si alloy will separate out. The grain boundary and the interface boundary of the aluminum alloy is the result of the defects of the crystal, the energy barrier for nucleation is smaller. Therefore, in the annealing process, the over-saturated silicon separates out. The silicon crystal 200 nucleates and grows within.

Reference is made to FIG. 3, which illustrates a cross-sectional diagram showing an Al—Si—containing alloy conductive line having silicon residue. The silicon crystals 200 are not removed in the etching process for defining the conductive lines and become residues on the surface of the substrate. Silicon crystal 200 between two conductive lines 204 forms a bridge and thus a short occurs therebetween. Further, a poorer electromigration resistance of the aluminum is caused by the silicon crystal 200 at the grain boundary 202 of the aluminum crystal.

SUMMARY OF THE INVENTION

In accordance with the above background of the invention, the conventional manufacturing method for forming an Al—Si—containing alloy conductive line has disadvantages. The silicon residue between the two Al—Si—containing alloy conductive lines causes these two lines to short and the yield decreases accordingly. Therefore, it is necessary find a process for manufacturing an Al—Si—containing alloy conductive line that improves upon the conventional approaches. It is therefore an objective of the present invention to provide a method for fabricating an Al—Si—containing alloy conductive line, in which the annealing process after the high temperature deposition process or thermal flow process is modified so that no silicon residue exists.

It is another an objective of the present invention to provide a method for fabricating an Al—Si—containing alloy conductive line, in which the temperature (after the high temperature deposition process or the thermal flow process) is lowered faster and escapes from the curve of solid solubility of silicon and aluminum. The temperature decreases so fast that there is no suitable condition (temperature and time) for the over-saturated silicon to nucleate and grow.

It is still another objective of the present invention to provide a method for fabricating an Al—Si—containing alloy conductive line, in which the rapidly lowering temperature (after the high temperature deposition process or thermal flow process lead the Al—Si—containing alloy into a sub-stable state. Al—Si—containing alloy in the sub-stable state preserves the high-temperature solubility of aluminum in silicon, even at room temperature. Therefore, the silicon does not separate from the aluminum-containing alloy.

In accordance with the foregoing and other objectives of the present invention, a method for fabricating an Al—Si—containing alloy conductive line is provided. A film of titanium, titanium silicide or tungsten titanium alloy is formed by deposition to lower the sheet resistance. A titanium nitride or a tungsten titanium alloy film is deposited as a barrier layer and an adhesion layer. The main portion of the conductive line is an aluminum-copper-silicon film, which is formed by high temperature sputtering between about 300° C. and 500° C. Finally, titanium nitride is deposited as an anti-reflection layer. The temperature for depositing titanium nitride is typically between about 100° C. and 200° C., but it also can be formed at room temperature. Therefore, before the deposition of the titanium nitride, the wafer is cooled down rapidly to about 20° C. or lower, followed by a titanium nitride deposition process. The time needed for cooling down the wafer is between about 1 second and 10 seconds.

In the conventional manufacturing method for forming an Al—Si—containing alloy conductive line, an aluminum-copper-silicon film is formed by high temperature sputtering between about 300° C. and 500° C. The wafer's temperature is lowered to between about 100° C. and 200° C., followed by a titanium nitride deposition process. After this, the wafer's temperature is cooled down to room temperature. These procedures are a slow cooling down process for Al—Si—containing alloy. The silicon separates out during the cooling down and titanium nitride deposition processes and the silicon nucleates and grows at the grain boundary of the aluminum and the interface boundary between the two films. For this reason, the method disclosed in this invention provides a rapid cooling down process, in which the temperature decreases so fast that there is no suitable condition for the over-saturated silicon to nucleate and grow.

Further-more, this invention provides another method for fabricating an Al—Si—containing alloy conductive line. A film of titanium, titanium silicide or tungsten titanium alloy is formed by deposition to decrease the sheet resistance as disclosed in the prior art. A titanium nitride or a tungsten titanium alloy film is deposited as a barrier layer and an adhesion layer. The main portion of the conductive line is an aluminum-copper-silicon film, which is formed by high temperature sputtering between about 300° C. and 500° C. The wafer's temperature is lowered for depositing the titanium nitride but the temperature is lowered by no more than about 50° C. That is to say the temperature for depositing titanium nitride is between about 250° C. and 450° C. Finally, the wafer is cooled rapidly to about 20° C. or lower. The time needed for cooling the wafer is between about 1 second and 10 seconds. Similarly, the temperature decreases so fast that there is no suitable condition (temperature and time) for the over-saturated silicon to nucleate and grow.

It is to be understood that both the foregoing general description and the following detailed description are examples, only, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
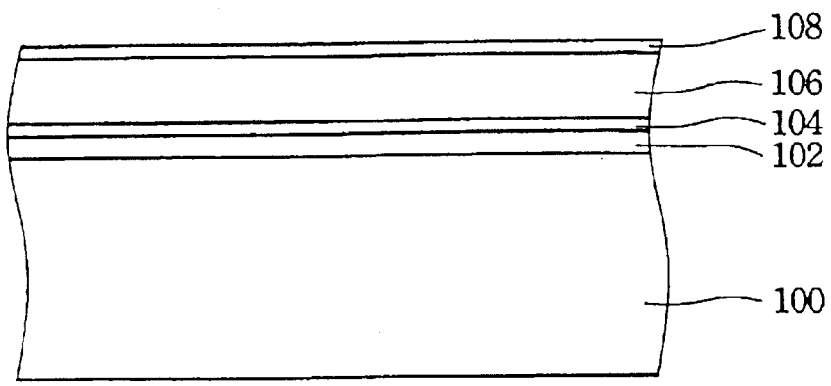
FIG. 1 is a schematic, cross-sectional diagram showing an Al—Si—containing alloy conductive line as disclosed in the prior art.
Figure 2:
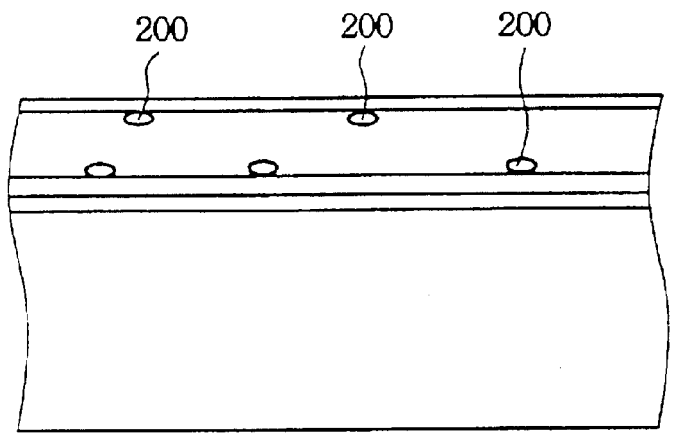
FIG. 2 is a schematic, cross-sectional diagram showing the silicon separated out in the Al—Si—containing alloy conductive line.
Figure 3:
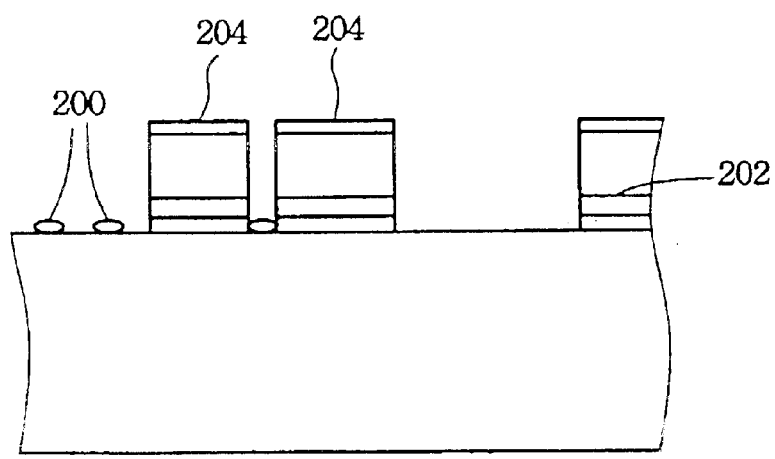
FIG. 3 is a schematic, cross-sectional diagram showing an Al—Si—containing alloy conductive line with silicon residue.

Reference will now be made in detail to the present preferred embodiments of the invention, examples of which are illustrated in the accompanying drawings. Wherever possible, the same reference numbers are used in the drawings and the description to refer to the same or like parts.

Embodiment 1

Figure 4:
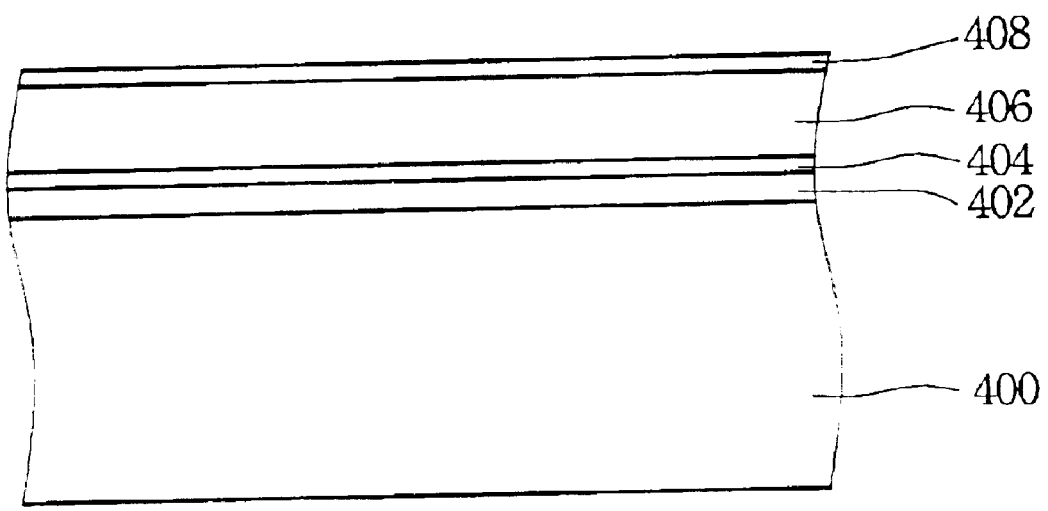
FIG. 4 and FIG. 5 are schematic, cross-sectional diagrams showing processes for fabricating an Al—Si—containing alloy conductive line according to one preferred embodiment of this invention.
Figure 5:
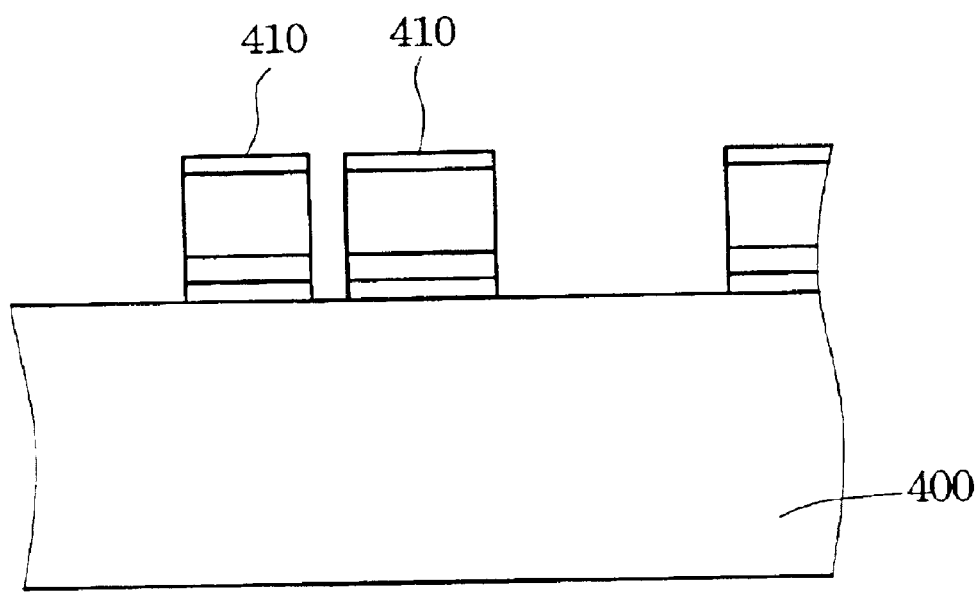
Figure 6:
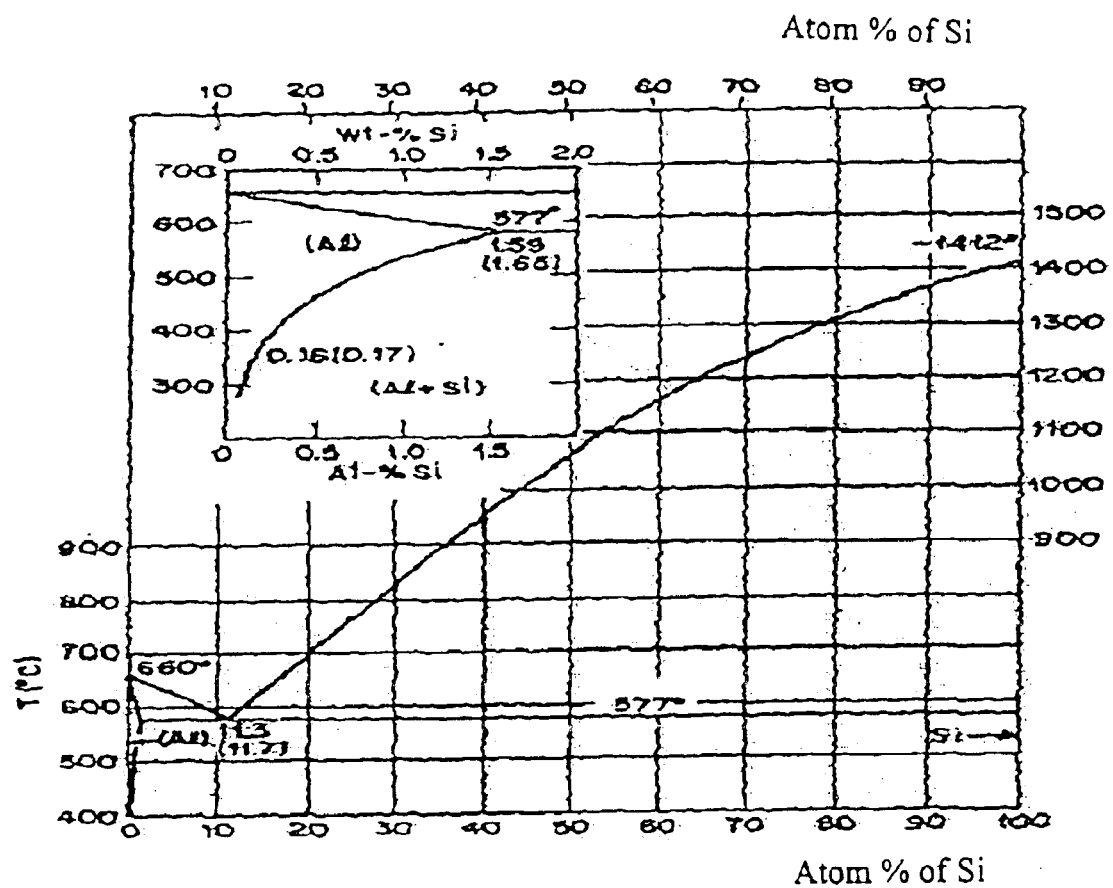
FIG. 6 is a schematic, phase diagram of the silicon percentage of the Al—Si alloy at different temperatures.

FIG. 4 and FIG. 5 are schematic, cross-sectional diagrams showing processes for fabricating an Al—Si—containing alloy conductive line 410. In FIG. 4, a conductive layer 402 made of titanium, titanium silicide or tungsten titanium alloy is formed on a substrate 400 by deposition to lower the sheet resistance between conductive line and plugs (not shown in the scheme). A conductive layer 404 made of titanium nitride or a tungsten titanium alloy film is deposited as a barrier layer and an adhesion layer. The main portion of the conductive line 410 is an aluminum-copper-silicon film 406, which is formed by high temperature sputtering at between about 300° C. and 500° C.

Finally, a titanium nitride layer 408 is deposited on the aluminum-copper-silicon film 406 as an anti-reflection layer. The temperature for depositing titanium nitride is typically between about 100° C. and 200° C., but it also can be formed at room temperature. Therefore, before the deposition of the titanium nitride layer 408, the substrate 400 is cooled rapidly to between about 0° C. and 25° C., and preferably between about 15° C. and 25° C., followed by a titanium nitride deposition process. The time needed for cooling the wafer is between about 1 second and 10 seconds, and preferably between 5 second and 10 seconds.

In FIG. 5, the titanium nitride layer 408, the aluminum-copper-silicon film 406, the conductive layer 404 and the conductive layer 402 are etched by a time control anisotropic etching process to form a conductive line 410 on the substrate 400.

Embodiment 2

Reference is again made to FIG. 4. A conductive layer 402 made of titanium, titanium silicide or tungsten titanium alloy is formed on a substrate 400 by deposition to lower the sheet resistance between conductive line and plugs (not shown in the scheme). A conductive layer 404 made of titanium nitride or a tungsten titanium alloy film is deposited as a barrier layer and an adhesion layer. The main portion of the conductive line 410 is an aluminum-copper-silicon film 406, which is formed by high temperature sputtering between about 300° C. and 500° C. The temperature of the substrate 400 is lowered for deposition of the titanium nitride but the temperature lowered by less than about 50° C. That is to say the temperature in the chamber (not shown in the scheme) for depositing titanium nitride is between about 250° C. and 450° C.

Afterwards, a titanium nitride layer 408 is deposited at a temperature of between about 250° C. and 450° C. The titanium nitride layer 408 is formed on the aluminum-copper-silicon film 406 as an anti-reflection layer. After that, the substrate 400 is cooled down rapidly to between about 0° C. and 25° C., and preferably between about 15° C. and 25° C. The time needed for cooling the wafer is between about 1 second and 10 seconds, and preferably between 5 about second and 10 seconds.

Reference is made to FIG. 5, in which the titanium nitride layer 408, the aluminum-copper-silicon film 406, the conductive layer 404 and the conductive layer 402 are etched by a time-controlled anisotropic etching process to form a conductive line 410 on the substrate 400.

The feature of the present invention is disclosed clearly in these two embodiments. The feature of the present invention is a rapid cooling down process to lower the temperature of the wafer (substrate) to about room temperature; this process is executed after an aluminum-copper-silicon film is formed. The rapidly lowering temperature after the high temperature deposition process or thermal flow process leads the Al—Si contained alloy into a sub-stable state. The Al—Si—containing alloy at the sub-stable state preserves high-temperature solubility of aluminum in silicon, even at room temperature. Therefore, the silicon does not separate out of the aluminum-containing alloy. The procedure of rapidly cooling the substrate also can be performed after the anti-reflection layer is formed. However, the temperature gap between the process of forming the Al—Si—containing alloy layer and the process of forming the anti-reflection layer is less than 50° C.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating conductive line on a wafer, at least comprising:
   forming an Al—Si contained alloy layer on the wafer;
   lowering the temperature of the substrate by no more than about 50° C.;
   forming an anti-reflection layer on the Al—Si contained alloy layer;
   rapidly lowering a temperature of the wafer to between about 0° C. and 25° C.;
   forming a patterned photo-resist layer on the Al—Si contained alloy layer; and
   using the patterned photo-resist layer as a mask, etching the Al—Si contained alloy layer to form the conductive line.

2. The method of claim 1 further comprises forming a first conductive layer before the Al—Si contained alloy layer formed.

3. The method of claim 2, wherein a material of the first conductive layer is selected from a group consisting of titanium, titanium silicide, tungsten silicide and a combination thereof.

4. The method of claim 1 further comprises forming a second conductive layer before the Al—Si contained alloy layer formed, the second conductive layer is a barrier layer.

5. The method of claim 4, wherein the second conductive layer is an adhesion layer.

6. The method of claim 1, wherein a material of the anti-reflection layer is titanium nitride.

7. The method of claim 1, wherein the temperature of the wafer is preferably lowered to between about 15° C. and 25° C.

8. The method of claim 1, wherein a time for rapidly lowering the temperature of the wafer is between about 1 and 10 seconds.

9. The method of claim 8, wherein a preferred time for rapidly lowering the temperature of the wafer is between about 5 and 10 seconds.

10. A method for fabricating conductive line on a substrate, at least comprising:
    forming a first conductive layer on the substrate;
    forming a second conductive layer on the first conductive layer;
    forming a Al—Si contained alloy layer on the second conductive layer;
    lowering the temperature of the substrate by no more than about 50° C.;
    forming a third conductive layer on the Al—Si contained alloy layer;
    rapidly lowering a temperature of the wafer to between about 0° C. and 25° C.;
    forming a patterned photo-resist layer on the third conductive layer; and
    using the patterned photo-resist layer as a mask, etching the third conductive layer, the Al—Si contained alloy layer, the second conductive layer and the first conductive to form the conductive line.

11. The method of claim 10, wherein a material of the first conductive layer is selected from a group consisting of titanium, titanium silicide, tungsten silicide and a combination thereof.

12. The method of claim 10, wherein a material of the second conductive layer is selected from a group consisting of titanium nitride and titanium—tungsten alloy.

13. The method of claim 10, wherein the second conductive layer is a barrier layer.

14. The method of claim 10, wherein the second conductive layer is an adhesion layer.

15. The method of claim 10, wherein a material of the third conductive layer is titanium nitride.

16. The method of claim 10, wherein the third conductive layer is an anti-reflection layer.

17. The method of claim 10, wherein the temperature of the wafer is preferably lowered to between about 15° C. and 25° C.

18. The method of claim 10, wherein a time for rapidly lowering the temperature of the wafer is between about 1 and 10 seconds.

19. The method of claim 18, wherein a preferred time for rapidly lowering the temperature of the wafer is between about 5 and 10 seconds.

* * * * *